United States Patent [19]

Frederick

[11] 4,027,205

[45] May 31, 1977

[54] ENVIRONMENTALLY PROTECTED ARC WELDING APPARATUS OF THE FORCED VENTILATION TYPE

[75] Inventor: James E. Frederick, Ellicott City, Md.

[73] Assignee: Westinghouse Electric Corporation, Pittsburgh, Pa.

[22] Filed: Dec. 3, 1975

[21] Appl. No.: 637,425

[52] U.S. Cl. .............................. 361/384; 174/16 R; 321/16; 361/379
[51] Int. Cl.² .......................................... H05K 7/20
[58] Field of Search ......... 219/135; 317/100, 40 R; 174/16 R; 321/16, 25

[56] References Cited

UNITED STATES PATENTS

| | | | |
|---|---|---|---|
| 3,253,696 | 5/1966 | Koltuniak | 174/16 R |
| 3,621,339 | 11/1971 | Hodgson | 174/16 R |
| 3,925,710 | 12/1975 | Ebert | 174/16 R |

*Primary Examiner*—Gerald P. Tolin
*Attorney, Agent, or Firm*—C. M. Lorin

[57] ABSTRACT

A compact and portable arc welding apparatus of the transformer reactor type having a main compartment cooled by forced ventilation and a side compartment sealed from hostile environment, the two compartments being part of a common housing which can be stacked on another similar equipped housing of an arc welding apparatus.

10 Claims, 10 Drawing Figures

ENVIRONMENTALLY PROTECTED ARC WELDING APPARATUS OF THE FORCED VENTILATION TYPE

BACKGROUND OF THE INVENTION

One of the more troublesome factors affecting the reliability and life of welding power supplies is foreign matter pulled into the system by the cooling air. To circumvent this condition, power supplies can be designed for convection cooling, e.g. without forced air; or they can be sealed and cooled by various methods. Usually, either approach increases the size, or the weight, or the cost, etc.

For example, welding power supplies have been in the past immersed in a liquid (such as transformer oil) and sealed. In such case, heat from the components is transferred through the oil to the case then to the atmosphere. In order to increase the effective thermal exchange area, the container may be finned.

Some of the cooling methods used in the past are:
1. Sealed power supply with derated power.
2. Sealed power supply with internal air circulation to transfer heat from the components to the case; also with additional air flow over the external surface of the case for increased heat dissipation.
3. Recirculation of the air through a water to air heat exchanger with removal of the heat by the cooling water. The water system may be part of or external to, a large central supply or it may be recirculated in a closed loop system. Occasionally, two heat exchangers have been employed: one inside the sealed power supply taking heat from the components; one outside the power supply removing heat from the circulated liquid (or gas).
4. Direct cooling of the components by liquid in a sealed case, the cooling liquid being in and out, or recirculated.
5. Sealed components cooled by a refrigeration system with evaporator inside the sealed welder and the condenser and compressor external to it.

All of these methods would protect the power supply from foreign matter, moisture, chemical atmospheres, etc. However, all are costly and in addition they forfeit the advantage of portability. Some compromise has been possible to provide longer life at a reasonable increase of the cost. For example, if the sealed power supply approach is chosen, a 500 amp machine has to be derated by a factor of approximately 4. The user installs equipment rated for 500 amps, which can only be operated at much less over an extended time period.

On the other hand, if the user settles for less reliability, the equipment with shorter life will cost more in the long term, all costs being considered. More costs are also involved to install, trouble shoot, and repair with the inevitable loss of production.

Hostile environment is a major problem with arc welding apparatus by reason of the conditions of work by welding. A study of field failures primarily in coastal atmospheres, or for chemical or petro chemical plants and, paper mills, or on construction sites, has shown that power transformers dipped and baked with insulating varnish hold up well in the hostile environments. So does a metal sheet that has received a coat of varnish during the transformer insulating process, whereas metal sheets with only standard finish would rust badly. Terminal boards when clogged with foreign matter and covered by moisture often "arc over". Destruction of the board and damage to the main transformer and other control components ensue. Exposed copper to copper, or copper to aluminum electrical connections would corrode severely. Relays, contactors, switches exposed to dirt and moisture often fall electrically and mechanically. Rough handling is also a common cause of damage to welder cases.

SUMMARY OF THE INVENTION

The present invention proposes a new approach to keep the size and cost of an arc welding apparatus within a reasonable range while providing better protection against hostile environment.

The invention resides in an environmentally protected compact and portable arc welding apparatus having a housing divided by a partition into two compartments. The first compartment includes main electrical equipment which is of the class H insulation type, e.g., capable of supporting relatively high temperatures, heavily protected against moisture, corrosion, and foreign particles. This first compartment is cooled by forced ventilation with the outside. The second compartment includes less highly protected equipment. In particular the more exposed control components for the main equipment are in the second compartment. An insulating terminal board is provided in this second compartment for mounting and connecting the electrical cables and components in the second compartment to permanently attached and available connections from, or going to, the main equipment in the first compartment and passed through the partition covering. A removable panel in the housing on the side of the second compartment gives access to the same for repair, replacement, or voltage connection changeover.

Thus, the apparatus provides:
1. A compartmentalized power supply
   a. The power components (main transformer and rectifier) are in a forced-air cooled section allowing the full rating of the equipment as in any standard unit. A fan motor is mounted in this compartment hermetically insulated and sealed and not subject to environmental damage. The rectifiers (diodes) are also hermetically insulated and sealed. The main transformer is varnished to the extent that it resists hostile environment. A multi-varnish dip and bake is used to further enhance this quality. A variable reluctance transformer/reactor design according to U.S. Pat. No. 2,957,118 of Steinert is used, having a moving core actuated by threaded shafts, sprocket wheels, and chains. The shaft, sprocket and chain are contained in a protecting cover.
   b. A second section forms a sealed compartment in the housing in which control components which are subject to environmental damage, but which in themselves add little heat loss, are protected. These include the primary connections, the OFF-/ON pushbuttons and circuits (contactors, control transformer, fuse, switches, and breaker), protection circuits (overload relays, amptrap fuses, rectifier surge suppression circuits), meters, shunts, power factor correcting capacitors, low voltage circuits for AC power supplies, arc drive circuits, etc. A reconnection insulating terminal board is mounted inside this sealed compartment to provide connecting attachments for the electrical components, as well as a mounting base.

An epoxy finish rather than the standard baked enamel is employed. Tests in salt chambers indicate that such finish significantly increases the case life at a modest cost premium. At the rear of the housing where the fan is exhausting the air, a plenum chamber increases air flow and cooling efficiency while preventing penetration of rain from the outside. The fan opening has no screen, the blade is allowed to protrude through the orifice into the plenum chamber thereby to increase both the efficiency of the fan and the exit area. Standard louvers provide communication from the plenum chamber to the outside.

BRIEF DESCRIPTION OF THE DRAWINGS

FIGS. 8, 8A and 8B illustrate the fan arrangement in the rear of the housing of FIG. 1.

THE PREFERRED EMBODIMENT OF THE INVENTION

The invention will be described in the context of a direct current arc welding apparatus. It is understood, however, that the present invention is applicable to an arc welder of the alternating current type and to constant potential as well as constant current types.

The mechanical structure of the apparatus disclosed in this application is, to a large extent, similar to the mechanical structure of the apparatus disclosed in the U.S. Pat. No. 2,752,529 dated June 26, 1956 of C. P. Croco et al or in the U.S. Pat. No. 2,957,118 dated Oct. 18, 1960 of E. F. Steinert et al, and the specification and drawings of the Croco and of the Steinert patents are for the purpose of this description, incorporated by reference herein, except for the distinctive features described hereinafter, and the same numeral references as in the above-identified patents are used wherever possible for convenience.

Figure 1:
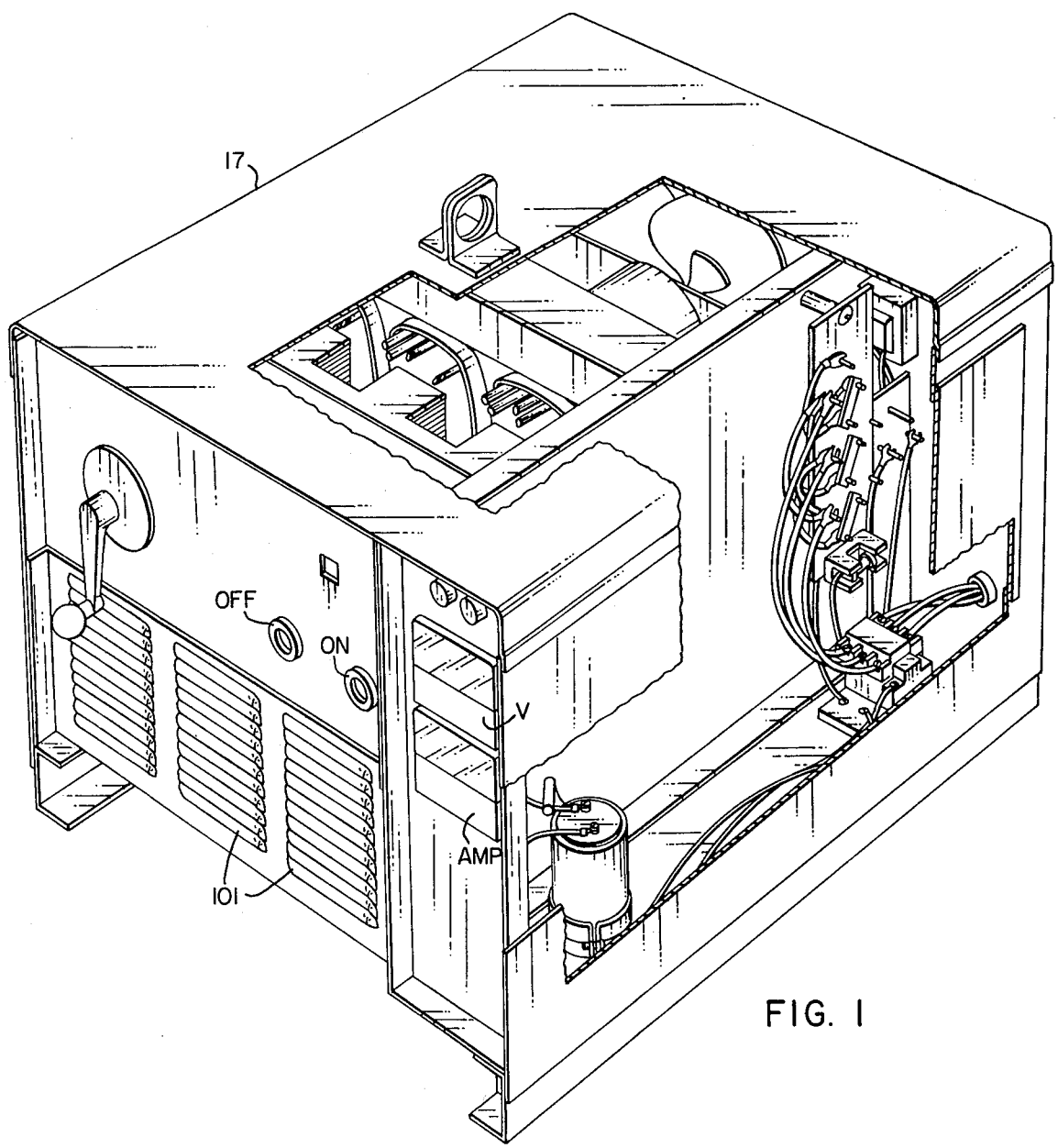
FIG. 1 is a perspective view of the arc welding apparatus according to the invention with part of the housing taken away.
Figure 2:
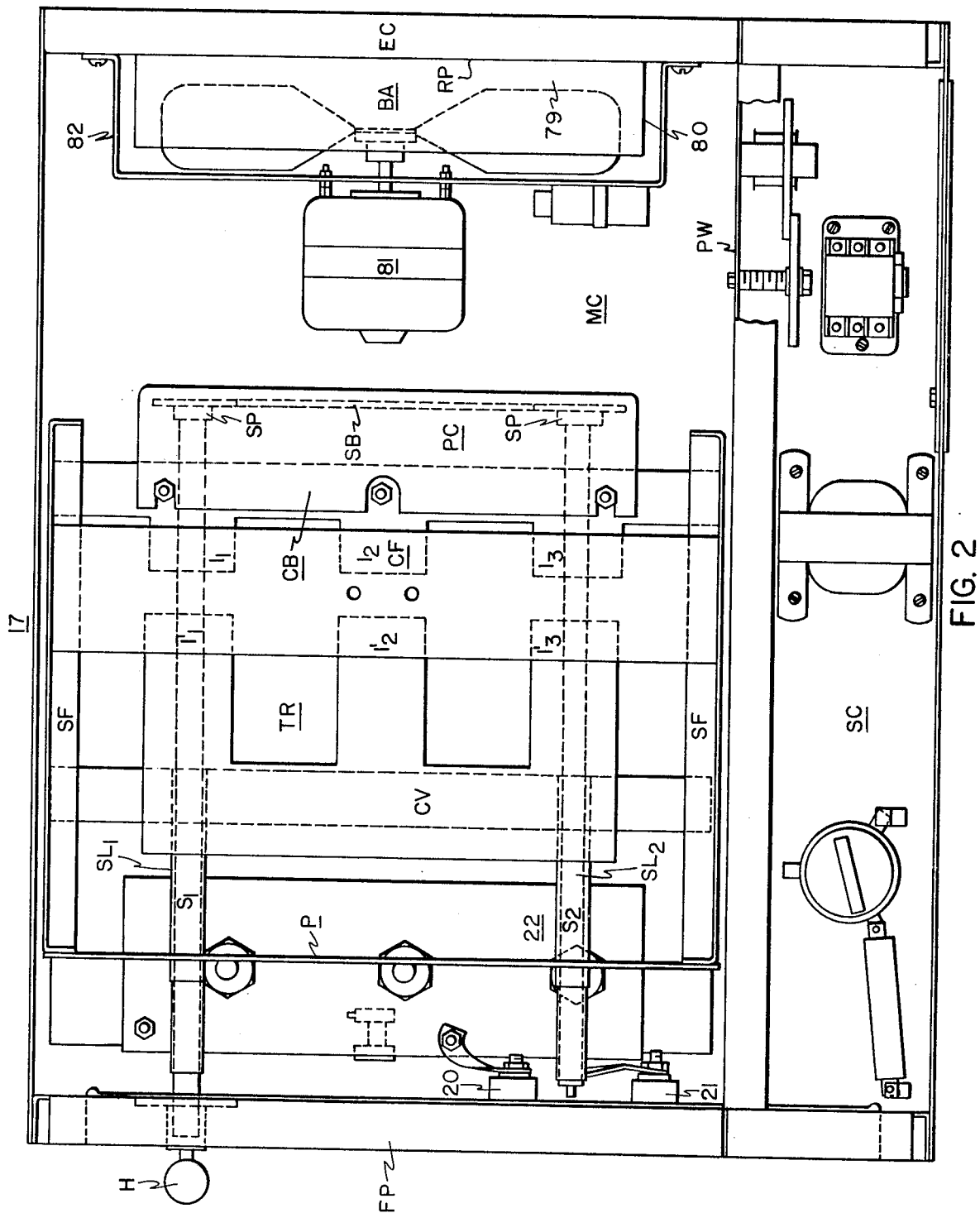
FIG. 2 is a view from the top of the inside of the housing of FIG. 1.

The apparatus shown in FIGS. 1 and 2 includes a housing 17 within which is mounted a polyphase transformer-reactor TR comprising a fixed three-legged core CF providing constant reluctance and a three-legged open core CV movable between two extreme portions to provide variable reluctance. Both coils are made of magnetized laminations as generally known. The primary of the transformer reactor includes three windings (not shown) each encircling a corresponding leg $1_1$, $1_2$, $1_3$ of the fixed core CF and supported on the cross lamination thereof. The secondary of the transformer and the reactor have windings (not shown) which are coupled with the respective primary coils. The secondary and primary coils together form three doughnut shaped transformers A, B, C which are adapted to receive the extremity of a corresponding leg $1'_1$, $1'_2$, or $1'_3$ of the variable core CV when the latter is in the maximum current position. The minimum current position of the variable core CV is then completely retracted. A bridge rectifier arrangement 22 is in circuit with the secondary windings providing, between two outlet terminals 20, 21, direct current power for the welding electrode and the workpiece. Terminals 20, 21 which are mounted on the front panel FP are outlets adapted to receive the main connectors for the welding electrode and the workpiece. The fixed core CF is mounted on a cross beam CB which is supported by side frames SF which are vertical supports for the transformer-reactor assembly TR. Two shafts $S_1$, $S_2$ are rotatably mounted through a baffle P, through the movable core CV and through the fixed core CF, respectively. Both rest at the other end on a bearing which carries sprocket drive and chain SB. Shaft $S_1$ is the master when the crank handle H is rotated. Shaft $S_2$ is a slave. Shafts $S_1$ and $S_2$ are mounted within the movable core CV by screw engagement so that rotation of the crank clockwise advances the movable core and increases the current, and counterclockwise has the opposite effect. These screw shafts are each protected by dust covers $SL_1$ and $SL_2$, which may either be of the telescoping type, a fixed cylinder or a tube that moves with the movable core CV.

Figure 8A:
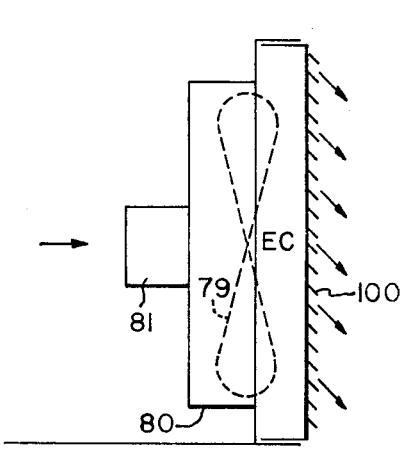
Figure 8B:
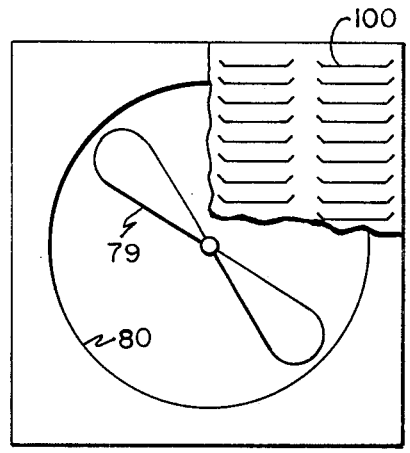

On the rear of the housing 17 is mounted a bracket 82 supporting the blower assembly BA comprising a fan 79 and a fan motor 81. An expansion chamber EC is provided right behind the propeller of the fan extending all the way across the compartment MC to the rear of panel RP and louvers 100 therein. Air is blown from louvers 101 in the front panel FP to louvers 100 in the rear panel RP. In order to improve an efficiency the fan is surrounded by a shroud 80 which creates a plenum in the expansion chamber EC between the fan and the back plate louvers as shown in FIGS. 8A and 8B.

Figure 7:
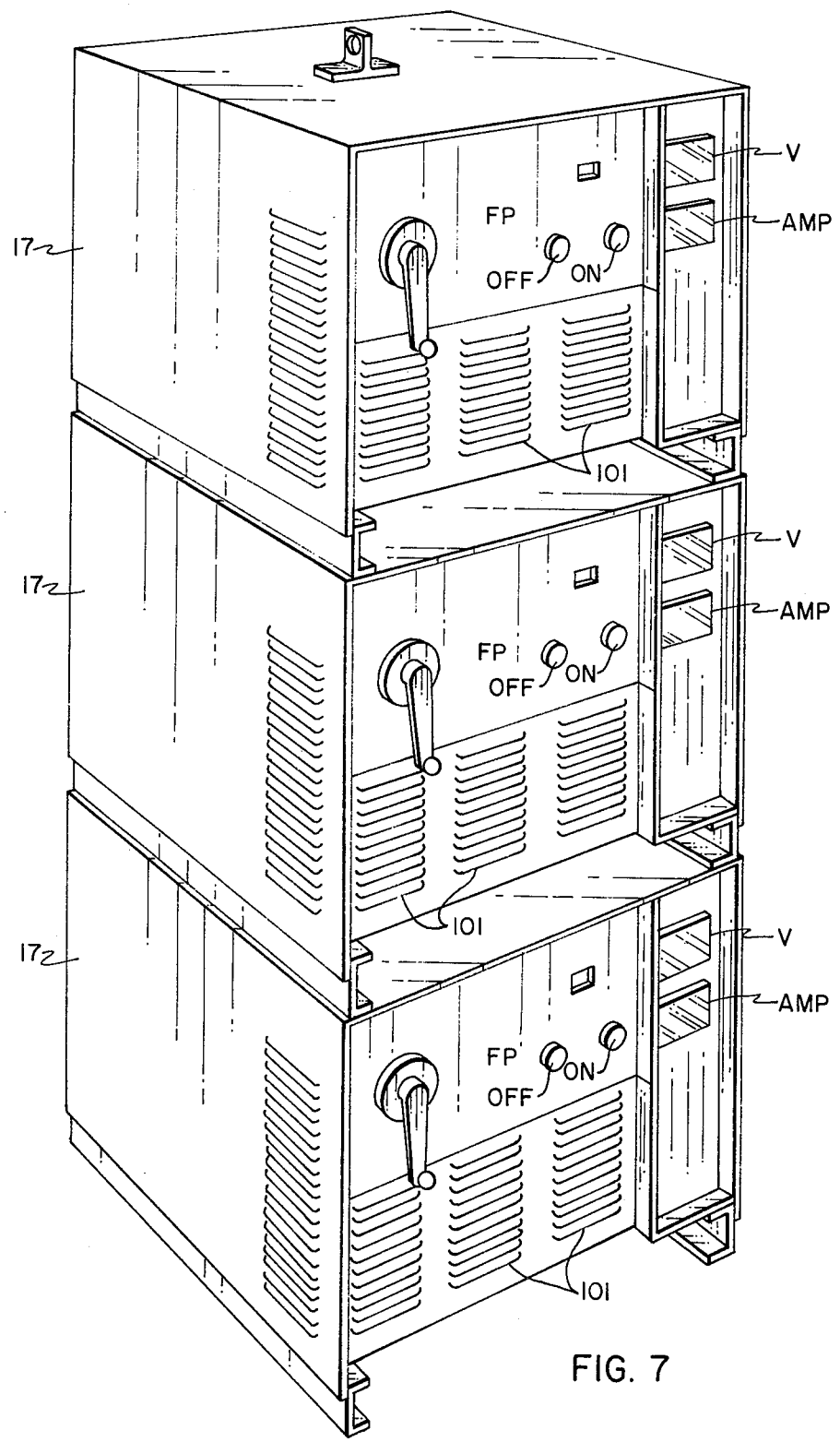
FIG. 7 shows several arc welding apparatus such as in FIG. 1 stacked on each other.

The housing, according to the present invention, is generally horizontal and longitudinal in the direction from the front panel FP to the rear panel RP, between a floor F resting on two rails. The vertical frames SF provide a resistance to vertical stress several times the weight of the housing and the contained equipment so that several apparatus such as shown can be stacked on each other as shown in FIG. 7. The housing is divided by a partition wall PW into two compartments. The main compartment MC contains the equipment hereinabove described, namely the transformer-reactor TR, the rectifier assembly 22 and the blower assembly BA. On the other side of the partition wall PW, the housing 17 contains a side compartment SC which, according to the present invention, is completely enclosed from the outside.

Figure 3:
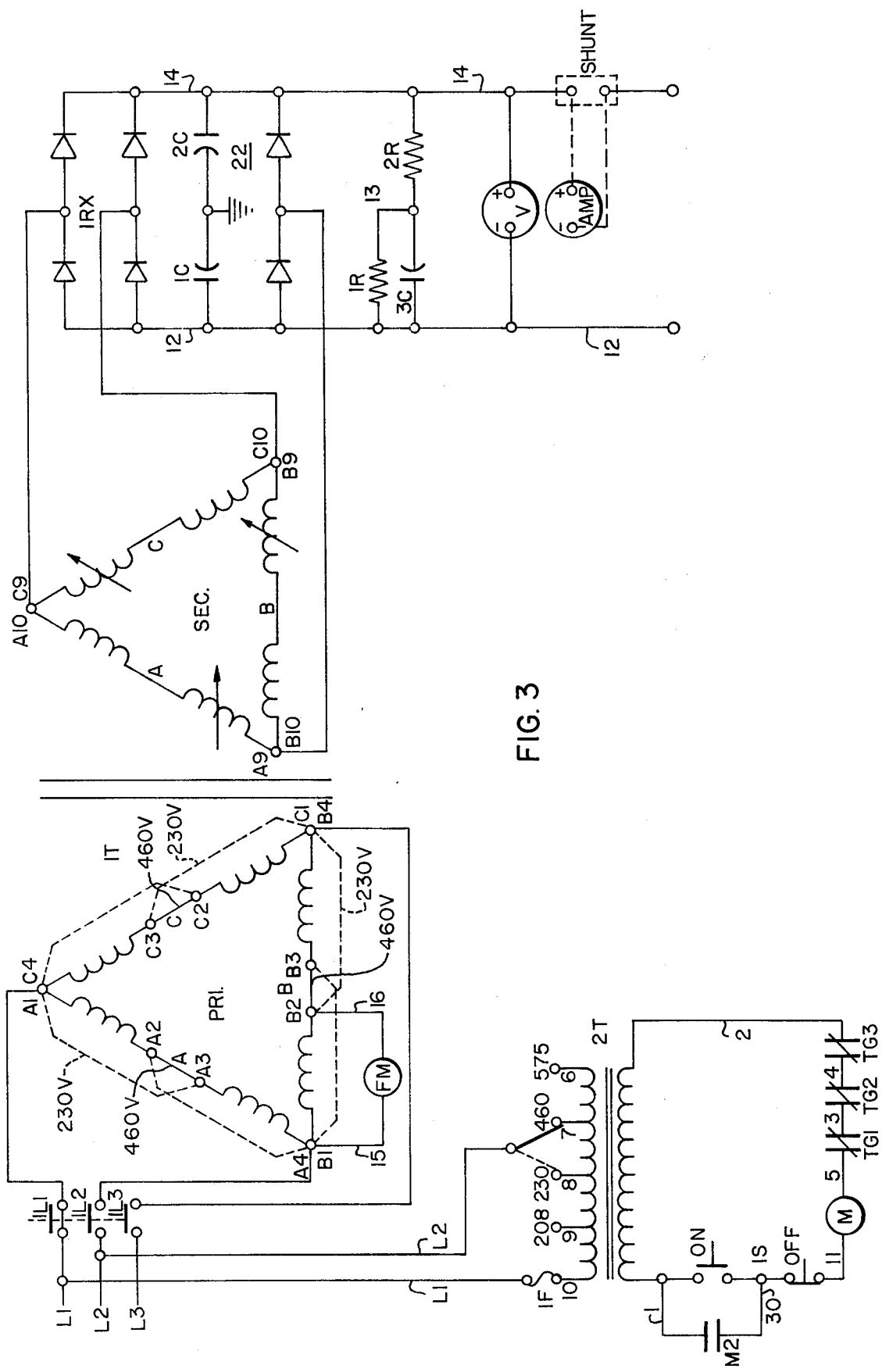
FIG. 3 illustrates electrical circuitry typical of an arc welding apparatus that can be used in the housing of FIG. 1.

Reference should be had now to FIG. 3 representing the electrical circuitry of an arc welder which can be used within the housing according to the invention. This circuitry is in accordance with the principles explained in the aforementioned patents of Croco and Steinert, the description and drawings of which are incorporated herein by reference. The power supply lines $L_1$, $L_2$, $L_3$ are derived from inlet terminals $a$, $b$, $c$ which can be plugged for connection with a commercial network of 230, 460, 208 or 575 volts as available. Interrupters $IL_1$, $IL_2$ and $IL_3$ are part of a main contactor mounted within the housing 17 and connected before the primary windings of the power transformer IT.

These windings are delta connected as shown in FIG. 3. Primary windings $A_1$-$A_2$, $A_3$-$A_4$ in coil A may be short circuited as indicated if only 230 volts are supplied; they are in series if 460 volts are supplied. Similarly, the primary windings $B_1$-$B_2$ and $B_3$-$B_4$ for coil B, and $C_1$-$C_2$ and $C_3$-$C_4$ for coil C complete the primary delta assembly. The secondary windings $A_9$-$A_{10}$ for coil A, $B_9$-$B_{10}$ for coil B and $C_9$-$C_{10}$ for coil C are also delta connected. The apices of the delta are connected to the branching point of the rectifier bridge assembly 22 to derive on lines 12, 14 direct current for the arc electrodes. Resistors 1R, 2R and capacitor 3C are used for surge suppression whenever an arc is being struck between electrode and workpiece. A shunt SH on line 14 provides current derivation to an amperemeter Amp. A voltmeter V is connected across lines 12, 14. From lines $L_1$ and $L_2$ power is derived to a control transformer 2T which can be set either for 230 volts, or 460 volts, in order to supply in either case 24 volts at the secondary. In the secondary circuit of the control transformer 2T, the contacts of an ON pushbutton and the contacts of an OFF pushbutton are connected in series, with the coil M of a relay having holding contacts $M_a$ in parallel to the contacts of the ON pushbutton. Also in series are three break contacts $TG_1$, $TG_2$, $TG_3$ which are similar to contacts $3TG_a$, $1TG_a$ and $2TG_a$ of bimetallic thermostats 3TG, 1TG and 2TG described in U.S. Pat. No. 3,058,031 dated Oct. 19, 1962 of Steinert et al. These thermostats are embedded in transformer coils A, B and C, and cause an interruption in the energizing circuit of relay M, whenever an excessive temperature manifests itself in the main transformer 1T.

Figure 4:
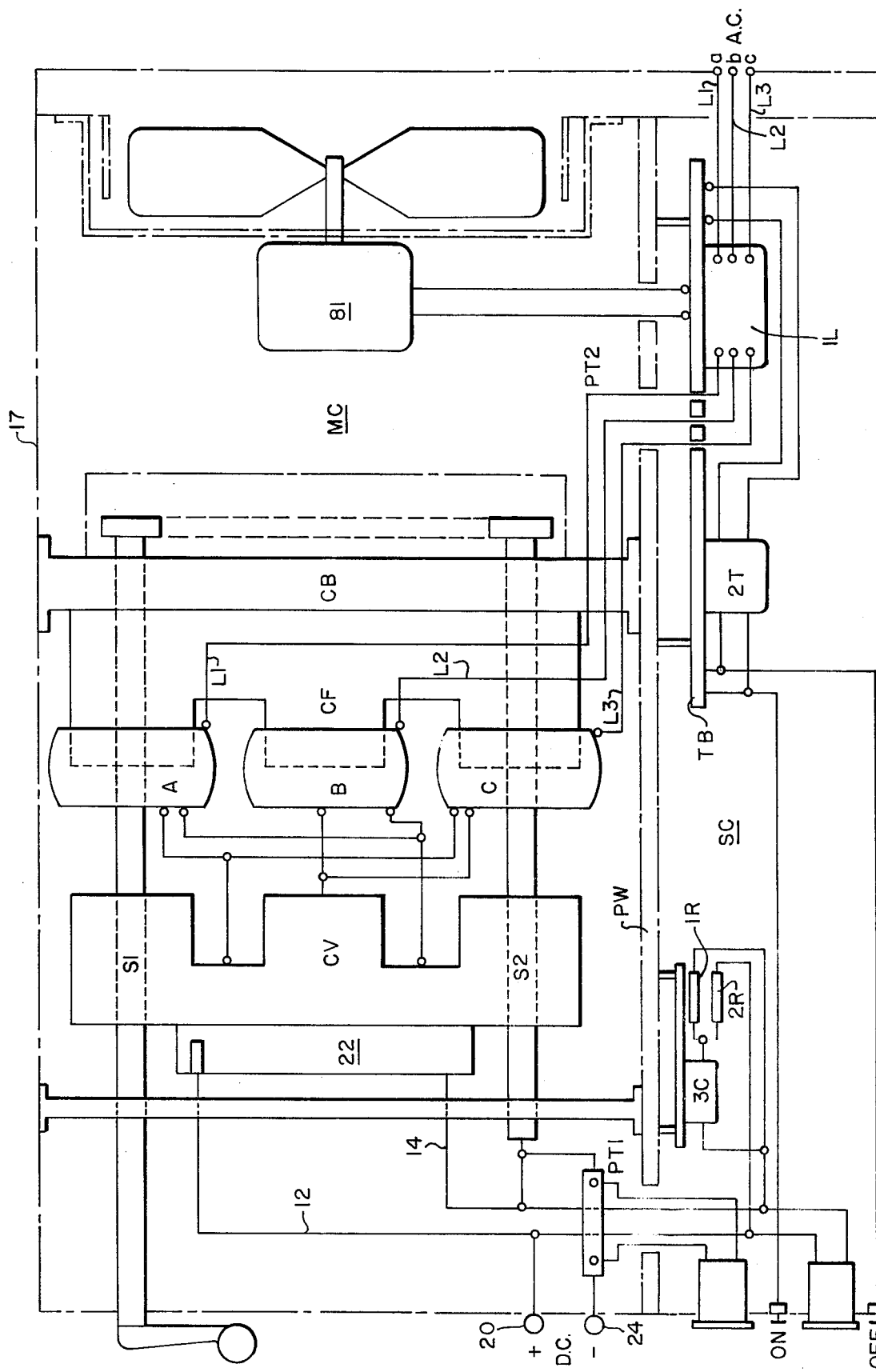
FIG. 4 is a view of the circuitry of FIG. 3 arranged to fit within the housing of FIG. 1.
Figure 5:
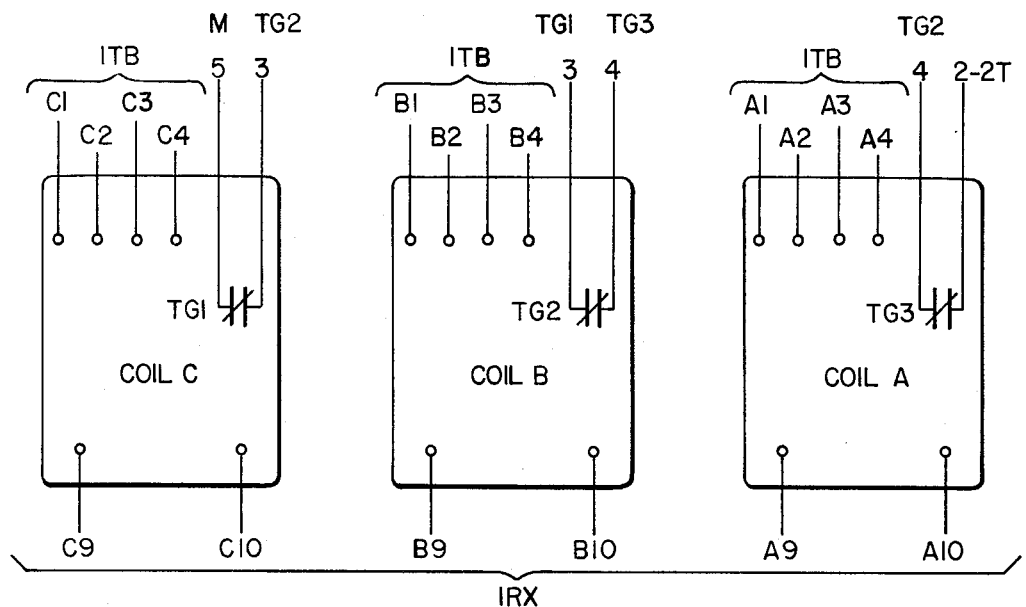
FIG. 5 is a view of the transformer coils of FIGS. 3 and 4 with cabling identification.

Reference should be had now to FIG. 4 which illustrates how the electrical circuitry of FIG. 3, is distributed between the two compartments MC and SC of the housing 17 according to the present invention.

In the main compartment MC are mounted the DC power supply $TR_1$22 and the fan assembly BA. All parts are completely protected from the ambient. For instance transformer coils A, B and C have been impregnated with insulating varnish and baked. The insulating materials are of the class H insulation type (180° C) for long life, and moisture resistance. The electrical cables to the transformer-reactor TR and to the rectifier assembly 22 are also totally insulated and protected. Special sleeves $SL_1$ and $SL_2$ (FIG. 2) are mounted around the shaft portions of $S_1$ and $S_2$ extending between baffle P and within the movable magnetic core CV in order to prevent penetration of foreign matter into the threads of the shaft. The moving core CV is of the heavy duty type, with chain and sprocket drive, all enclosed in a protecting cover PC. The rectifier bridge assembly 22 includes silicon diodes providing maximum thermal efficiency. The fan motor 81 is a totally enclosed, pre-lubricated single phase motor. The shroud 80 creates a plenum in the expansion chamber EC at the rear of the fan for maximum cooling efficiency. The air is blown lengthwise through the main compartment MC from louvers 101 in the front panel FP to louvers 100 in the rear panel RP of the housing 17.

Thus, ventilation of the main compartment can be obtained without risk of damaging the electrical equipment or other structural parts therein despite the very unfavorable working environment or climatic condition to which such apparatus may be exposed such as dust, dirt, chemical mists, salt spray, in a factory or on construction sites, such as excessive humidity and corrosive atmosphere near the sea when on offshore drillers and in the shipyards.

Beside the main compartment MC, the housing 17 includes a side compartment SC which, as shown in FIG. 4, contains other portions and components of the electrical circuitry of FIG. 3. Compartment SC rests on the same floor as compartment MC, and also lies between the front and rear panels FP, RP. It is separated from the main compartment by a partition wall PW which does not allow any fluid communication with the main compartment MC. Two ports PT1 and PT2 are provided across the partition wall PW to allow electrical cables to be passed from one compartment to the other.

Through port PT1 are passed connections from the DC outlet terminals lines 12, 14 to a voltmeter V and connections from a shunt SH, mounted in series with terminal line 14, to an amperemeter Amp. The voltmeter V and the amperemeter Amp are mounted for display on the portion of the front panel FP facing the side compartment SC.

Port PT1 is also traversed by connections from the line terminals to the surge suppressor comprising capacitor 3C, series resistor 2R and parallel resistor 1R. These components are floor mounted inside compartment SC and in proximity to port PT1 in the frontal area of the housing.

At the rear of compartment SC, the rear panel RP is provided inlet terminals $a$, $b$, $c$ for the industrial power supply, e.g. a 230 volt, or a 460 volt, three-phase AC source.

Figure 6A:
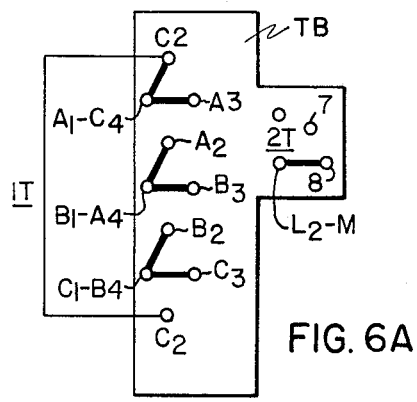
FIGS. 6A and 6B are an elevation view of the terminal board of the second compartment shown in FIGS. 1, 2 and 4 with two differential connecting positions of the connectors.
Figure 6B:
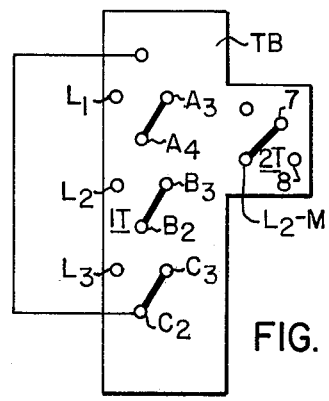

An insulating terminal board TB is mounted on the partition wall TW inside compartment SC. The terminal board TB is also shown in elevation on FIGS. 6A and 6B for two different connecting positions. Terminal board TB serves several purposes. First, it provides an insulated mounting for circuit components inside compartment SC, such as the fuse block F for control transformer 2T. The main contactor IL including three individual interrupters $IL_1$, $IL_2$, $IL_3$ for the expective phase lines are mounted on board floor. Contactor IL also includes a relay M which has an energizing coil having in series the contacts of pushbuttons ON and OFF. Relay M controls the line interrupters and the hold contacts $M_a$ in parallel with the contacts of pushbutton ON. Beside providing mechanical support and insulation for such components of the electrical circuitry, terminal board TB is also a connecting board for the terminals of the cables and connections associated with these components. The three cables $L_1$, $L_2$, $L_3$ from the AC inlet terminals $a$, $b$, $c$ are connected to the board TB by connectors 50, 51, 52, and the three corresponding cables from the main contactor IL are also connected to these three connectors, respectively. In the same fashion, cables $L_1$, $L_2$, $L_3$ from the primary of coils A, B, C of transformer-reactor TR, are passed through port PT2 and connected to connectors 60, 61, 62. To these connectors are also attached three corresponding cables from the main contactor IL. FIG. 6A shows how connectors 60, 61, 62 may be arranged in order to select the proper winding arrangement within the primary of coils A, B, C so as to match a 230 volt supply. FIG. 6B shows the testing when the 460 volt power supply is actually used. Also, a similar changeover between connecting positions is possible for the primary input of the control transformer 2T.

Referring to FIG. 6A and by reference to FIG. 3 for the primary of the main transformer 1T the connecting positions for a 230 volt supply are shown by connectors CL placed between points $C_2$-$C_4$ and $A_1$-$A_3$ for one side of the triangle, between $A_2$-$A_4$ and $B_1$-$B_2$ for the second side, between $B_2$-$B_4$ and $C_1$-$C_3$ for the third side of the triangle. Between points $B_1$ and $B_2$ are the cables to the fan motor FM. On the terminal board TB are also connecting points $M_1$, $M_2$, $M_3$. $M_1$ receives the connecting cable from point 7 of the primary of transformer 2T. $M_2$ receives the cable from pont 8 of the primary of transformer 2T. $M_3$ is the point for connecting supply line $L_2$ and relay M. FIG. 6A shows a connector CL placed between $M_3$ and $M_2$ for a 230 volt power supply. FIG. 6B shows connector CL positioned on the same board TB for a 460 volt supply.

The side wall SW of the housing 17 which is contiguous to the side compartment SC is provided with a removable panel which permits easy access to the control components and connections, for checking, repair, or connector changeover. The fuse "F" for the AC terminals of the control circuit is also mounted on the terminal board TB.

Although the apparatus according to the present invention has been described in the context of an arc welder with direct current, the side compartment and the main compartment are also effective to separate exposed and nonexposed portions forming part of the equipment of an alternating current arc welder, as well. The same philosophy in design is applicable. Also, it is not necessary to use an arc welder exactly of the type described in the aforementioned Croco and Steinert patents. Additional, or other, circuit components which can be made corrosive resistant, which can be fully protected against moisture, permanently coated and thermally protected as well as electrically insulated, are those which can be mounted within the main compartment MC where ventilation is allowed despite the hostile environment in which the apparatus is to be used. On the other hand, any portion or component of the circuitry which cannot be so protected and would need replacement, or frequent inspection, in particular the control portion of the arc welder, would be placed in the side compartment SC and movably mounted on the terminal board TB, therein.

I claim:

1. An environmentally protected portable arc welding apparatus comprising:
    a housing having a first and a second compartment separated by a partition, said first compartment being forced-air cooled, said second compartment being sealed from the atmosphere;
    first electrical means of the class H insulation type mounted in said first compartment for providing power to outlet terminals on said housing;
    second electrical means mounted in said second compartment for deriving alternating current electrical power from inlet terminals on said housing;
    said first electrical means having electrical connections passed through said partition; and
    said second compartment including insulating terminal board means mounted therein connecting said input electrical connections of said first electrical means with said electrical means.

2. The apparatus of claim 1 with said second electrical means including control means for said first electrical means and connected to said electrical connections through said terminal board means.

3. The apparatus of claim 2 with said second compartment having a removable door for access to said second electrical means and to said terminal board means.

4. The apparatus of claim 2 with said housing having a front and a rear panel and a longitudinal direction from said front to said rear panel, each said panel having louvers therein with ventilating means being provided in the rear of said first compartment for forced-air ventilation with the outside through said louvers.

5. The apparatus of claim 4 with means forming a plenum in the back of said ventilating means and in proximity to the louvers of said rear panel.

6. The apparatus of claim 5 with said inlet terminals being in said rear panel and in said second compartment, said first electrical means including means for connecting alternating current power to direct current and low voltage for derivatives at said outlet terminals, being in said front panel.

7. The apparatus of claim 6 with said second electrical means including primary power line contactors connected between said housing inlet terminals and said terminal board means, said electrical connections being connected to said line contactors via said terminal board means.

8. The apparatus of claim 7 including pushbutton means mounted on said front panel and on said second compartment for actuating said line contactors within said second compartment.

9. The apparatus of claim 6 with said first electrical means and said electrical connections having a plurality of wiring settings, with said terminal board means being provided with selectable convectors in relation with said wiring settings and in correspondence with the voltage ratings of the alternating current derived on said inlet terminals.

10. The apparatus of claim 6 with said alternating current connecting means including variable reluctance reactor means actuated through said front panel of said housing.

* * * * *